United States Patent
Shinohara et al.

(10) Patent No.: US 8,835,966 B2
(45) Date of Patent: Sep. 16, 2014

(54) SEMICONDUCTOR LIGHT-EMITTING ELEMENT, LAMP, ELECTRONIC DEVICE AND MACHINE

(75) Inventors: Hironao Shinohara, Ichihara (JP); Remi Ohba, Ichihara (JP)

(73) Assignee: Toyoda Gosei Co., Ltd., Aichi (JP)

( * ) Notice: Subject to any disclaimer, the term of this patent is extended or adjusted under 35 U.S.C. 154(b) by 0 days.

(21) Appl. No.: 13/809,121

(22) PCT Filed: Jul. 5, 2011

(86) PCT No.: PCT/JP2011/065385
§ 371 (c)(1),
(2), (4) Date: Jan. 8, 2013

(87) PCT Pub. No.: WO2012/005252
PCT Pub. Date: Jan. 12, 2012

(65) Prior Publication Data
US 2013/0113012 A1    May 9, 2013

(30) Foreign Application Priority Data

Jul. 9, 2010    (JP) ................................ 2010-156773

(51) Int. Cl.
*H01L 33/00* (2010.01)
*H01L 31/00* (2006.01)
*H01L 21/00* (2006.01)
*H01L 33/38* (2010.01)
*H01L 33/60* (2010.01)
*H01L 33/46* (2010.01)
*H01L 33/42* (2010.01)
*H01L 33/14* (2010.01)
*H01L 33/10* (2010.01)

(52) U.S. Cl.
CPC ............ *H01L 33/60* (2013.01); *H01L 33/38* (2013.01); *H01L 33/46* (2013.01); *H01L 33/42* (2013.01); *H01L 33/145* (2013.01); *H01L 33/10* (2013.01)
USPC .......... 257/98; 257/13; 257/79; 257/E33.072; 257/E33.068; 257/E33.062; 438/29; 438/69; 438/46; 438/72; 438/636

(58) Field of Classification Search
CPC ......... H01L 33/46; H01L 33/60; H01L 33/08; H01L 33/26; H01L 33/44; H01L 33/10; H01L 33/18; H01L 33/405; H01L 51/5068; H01L 51/50; H01L 51/5084; H01L 51/5218; H01L 51/5265; H01L 51/5271; H01L 27/288; H01L 27/30; H01L 21/0276
USPC ................... 257/13, 21, 79, 98, 99, 184, 437, 257/E33.068, E33.072, E33.066, E33.062; 438/29, 69, 46, 72, 636
See application file for complete search history.

(56) References Cited

U.S. PATENT DOCUMENTS

2002/0047128 A1    4/2002    Song et al.
2003/0146438 A1    8/2003    Tu et al.
(Continued)

FOREIGN PATENT DOCUMENTS

JP    08-250769 A    9/1996
JP    10-163531 A    6/1998
(Continued)

OTHER PUBLICATIONS

International Search Report of PCT/JP2011/065385 dated Sep. 13, 2011.
(Continued)

*Primary Examiner* — Julio J Maldonado
*Assistant Examiner* — Moazzam Hossain
(74) *Attorney, Agent, or Firm* — Sughrue Mion PLLC (57) ABSTRACT

A semiconductor light-emitting element (1) is provided which includes a semiconductor layer (10), an n-type electrode (18) which is provided on an exposed surface (12*a*) of an n-type semiconductor layer, wherein an exposed surface is exposed by removing a part of the semiconductor layer (10), a transparent conductive film which is provided on the semiconductor layer (10) and a p-type electrode (17) which is provided on the transparent conductive film; a light-reflecting layer (39) is provided between the semiconductor layer (10) and the transparent conductive film, wherein at least part of the light-reflecting layer overlaps with the p-type electrode (17) in the planar view; the p-type electrode (17) comprises a pad portion (P) and a linear portion (L) which linearly extends from the pad portion (P) and has an annular structure in the planar view; the n-type electrode (18) exists in an inner area which is surrounded by the linear portion (L) and exists on a straight line (L1) which goes through a center (17*a*) of the pad portion (P) and a center (10*a*) of the semiconductor layer (10); and the distance (D3) between the center (18*a*) of the n-type electrode (18) and the center (17*a*) of the pad portion (P) is greater than or equal to the distance (D4) between the center (17*a*) of the pad portion (P) and the center (10*a*) of the semiconductor layer (10).

18 Claims, 6 Drawing Sheets

(56) References Cited

U.S. PATENT DOCUMENTS

| | | |
|---|---|---|
| 2006/0273335 A1 | 12/2006 | Asahara et al. |
| 2007/0228388 A1* | 10/2007 | Ko et al. .................. 257/79 |
| 2009/0057707 A1 | 3/2009 | Katsuno et al. |
| 2011/0156065 A1 | 6/2011 | Kadan et al. |
| 2012/0097922 A1* | 4/2012 | Masuya et al. ............ 257/13 |

FOREIGN PATENT DOCUMENTS

| | | |
|---|---|---|
| JP | 2002-094118 A | 3/2002 |
| JP | 2002-319704 A | 10/2002 |
| JP | 2003-069074 A | 3/2003 |
| JP | 2006-128296 A | 5/2006 |
| JP | 2006-156590 A | 6/2006 |
| JP | 2008159957 A | 7/2008 |
| JP | 2008-300719 A | 12/2008 |
| JP | 2009-010280 A | 1/2009 |
| JP | 2009-049267 A | 3/2009 |
| TW | 521445 B | 2/2003 |
| WO | 2006/006555 A1 | 1/2006 |
| WO | 2010/024375 A1 | 3/2010 |

OTHER PUBLICATIONS

Taiwanese Office Action dated Nov. 7, 2013 issued in Taiwanese Patent Application No. 100124151.

Japanese Office Action for corresponding Japanese Patent Application No. 2010-156773, dated May 13, 2014.

* cited by examiner

SEMICONDUCTOR LIGHT-EMITTING ELEMENT, LAMP, ELECTRONIC DEVICE AND MACHINE

TECHNICAL FIELD

The present invention relates to a semiconductor light-emitting element, a lamp, an electronic device and a machine, and particularly relates to a semiconductor light-emitting element, wherein a sufficiently decreased forward voltage (VF) can be used even when high current is applied thereto and high light emission output (hereinafter, it may be described as "output") can be achieved, a lamp, an electronic device and a machine, wherein they are equipped with the semiconductor light-emitting element.

Priority is claimed on Japanese Patent Application No. 2010-156773, filed Jul. 9, 2010, the content of which is incorporated herein by reference.

BACKGROUND ART

With respect to a semiconductor light-emitting element which is used in a light-emitting diode (LED) or the like, there has been a demand for an increased uniformity of luminance which is achieved by decreasing nonuniformity of light emission in a light-emitting surface.

As a technology for achieving such a demand, a LED chip has been proposed wherein, in the surface of a chip, at least a part of a p-side electrode and at least a part of an n-side electrode are provided in parallel to each other, and, in a direction that goes across said parts provided in parallel, other parts of the p-side electrode and the n-side electrode are provided alternatively (for example, refer to Patent document 1).

On the other hand, in order to provide a semiconductor light-emitting diode having an electrode pad which can use current efficiently, it has been proposed that a high resistance layer be provided under an electrode pad on a utilized surface of a pn junction to control flowing current (for example, refer to Patent document 2). Furthermore, a technology wherein a linear electrode is attached to a part of the p and n electrodes is disclosed in the document.

PRIOR ART DOCUMENTS

Patent Documents

Patent Document 1: Japanese Unexamined Patent Application, First Publication No. 2002-319704
Patent Document 2: Japanese Unexamined Patent Application, First Publication No. H 8-250769

DISCLOSURE OF INVENTION

Problem to be Solved by the Invention

However, with respect to a conventional semiconductor light-emitting element wherein an insulating film is provided as an under layer of a p-type electrode, there is a demand that an output be further improved at the time of applying a high current. Furthermore, light emitted under a metal electrode such as a linear electrode or the like is adsorbed by the metal electrode to cause a deterioration of the light emission output.

The present invention was made in light of the aforementioned circumstances, and the purpose of the present invention is to provide a semiconductor light-emitting element which can achieve high output due to the application of a large volume of current; and a lamp, electronic devices and mechanical apparatuses which are equipped with the semiconductor light-emitting element.

Furthermore, the purpose of the present invention is to provide a semiconductor light-emitting element which can sufficiently reduce the forward voltage (Vf) as compared with a conventional element, with respect to a semiconductor light-emitting element which has a large chip size, and a lamp equipped with the semiconductor light-emitting element.

Furthermore, the purpose of the present invention is to provide a semiconductor light-emitting element wherein it is equipped with an electrode made of metal which includes a linear portion extending linearly from a bonding pad, and can decrease the amount of light which is absorbed by an electrode made of metal and achieve sufficient high light emission output, and a lamp equipped with the semiconductor light-emitting element.

Furthermore, the purpose of the present invention is to provide a semiconductor light-emitting element which can increase diffusion efficiency of current which is injected to a light-emitting layer, and a lamp equipped with the semiconductor light-emitting element.

Means for Solving the Problem

The present inventors have intensively studied with respect to the aforementioned purposes in order to increase the output of a semiconductor light-emitting element at the time of applying high current.

As a result, it was found that:

when a transparent conductive film is provided on a semiconductor layer, and a light-reflecting layer is provided between the semiconductor layer and the transparent conductive film so that at least a part of the light-reflecting layer overlaps with a p-type electrode in the planar view, it is possible to decrease the absorbed amount of light which is emitted from a light-emitting layer and is absorbed by the p-type electrode when a light-reflecting layer is not provided; and when the p-type electrode is composed of a pad portion and a linear portion which linearly extends from the pad portion and has an annular structure in the planar view, an n-type electrode exists in an inner area which is surrounded by the linear portion and exists on a straight line which goes through the center of the pad portion and the center of the semiconductor layer in the planar view; and the distance between the center of an n-type electrode and the center of the pad portion is greater than or equal to the distance between the center of the pad portion and the center of the semiconductor layer, it is possible to improve uniformity of current diffusion at a transparent conductive film while decreasing the absorbed amount of light which is emitted from a light-emitting layer and then absorbed by the p-type electrode.

That is, the present invention provides the following means.

(1) A semiconductor light-emitting element which comprises:
on a substrate,
a semiconductor layer which includes an n-type semiconductor layer, a light-emitting layer and a p-type semiconductor layer;
an n-type electrode which is provided on an exposed surface of the n-type semiconductor layer, wherein the exposed surface is exposed by removing a part of the semiconductor layer,
a transparent conductive film which is provided on the semiconductor layer, a p-type electrode which is provided on the transparent conductive film, and a light-reflecting layer which is provided between the semiconductor layer and the transparent conductive film, wherein at least a part of the light-reflecting layer overlaps with the p-type electrode when the light-reflecting layer is observed in planar view, wherein the p-type electrode comprises a pad portion and a linear portion which linearly extends from the pad portion and has an annular structure when the electrode is observed in planar view, the n-type electrode exists in an inner area, which is surrounded by the linear portion, and exists on a straight line which goes through the center of the pad portion and the center of the semiconductor layer when the linear portion is observed in planar view, and the distance between a center of the n-type electrode and a center of the pad portion is equal to or greater than the distance between the center of the pad portion and the center of the semiconductor layer.

(2) The semiconductor light-emitting element described in (1), wherein the linear portion is divided at a part thereof.

(3) The semiconductor light-emitting element described in (1) or (2), wherein a form of a part of the n-type electrode, which faces the pad portion, is a curved part which protrudes to the pad portion side when the part is observed in planar view.

(4) The semiconductor light-emitting element described in any one of (1) to (3), wherein the light-reflecting layer is composed of an insulating material.

(5) The semiconductor light-emitting element described in any one of (1) to (4), wherein the refractive index of the semiconductor layer is in a range of 1.9 to 2.6, and the refractive index of the transparent conductive film is in a range of 1.9 to 2.2 and the light-reflecting layer is composed of $SiO_2$.

(6) The semiconductor light-emitting element described in any one of (1) to (5), wherein the semiconductor layer has a form of a rectangle, wherein the side length of the rectangle is in a range of 450 μm to 1.5 mm, when it is observed in planar view, and the width of the linear portion is in a range of 0.1 μm to 20 μm.

(7) A lamp which is equipped with the semiconductor light-emitting element according to any one of (1) to (6).

(8) An electronic device which is equipped with the lamp according to (7).

(9) A machine which is equipped with the electronic device according to (8).

Effect of the Invention

A semiconductor light-emitting element according to the present invention has a structure wherein the semiconductor light-emitting element has: on the substrate, a semiconductor layer which includes an n-type semiconductor layer, a light-emitting layer and a p-type semiconductor layer; an n-type electrode which is provided on the exposed surface of the n-type semiconductor layer, wherein the exposed surface has been exposed by removing a part of the semiconductor layer; a transparent conductive film provided on the semiconductor layer; and a p-type electrode provided on the transparent conductive film; and a light-reflecting layer is provided between the semiconductor layer and the transparent conductive film, wherein at least a part of the light-reflecting layer overlaps with the p-type electrode when the light-reflecting layer is observed in planar view; the p-type electrode comprises a pad portion and a linear portion which linearly extends from the pad portion and has an annular structure when the linear portion is observed in planar view. Accordingly, it is possible to suppress the amount of light absorbed by the p-type electrode efficiently, to achieve excellent uniformity of current diffusion at the transparent conductive film, to achieve a sufficiently decreased forward voltage (VF) even when high current is applied thereto, and to achieve high emitting output.

Furthermore, in the semiconductor light-emitting element of the present invention, the n-type electrode exists in an inner area, which is surrounded by the linear portion, and exists on a straight line which goes through the center of the pad portion and the center of the semiconductor layer; and the distance between the center of the n-type electrode and the center of the pad portion is greater than or equal to the distance between the center of the pad portion and the center of the semiconductor layer, and therefore, high light-emitting output can be achieved.

Furthermore, in the semiconductor light-emitting element of the present invention, the p-type electrode includes a pad portion and a linear portion which linearly extends from the pad portion and has an annular structure when the linear portion is observed in the planar view, and therefore, it is possible to achieve a larger light-emitting layer area and a higher light-emitting output as compared with a case wherein an electrode having a linear portion is formed as an n-type electrode.

Furthermore, a lamp of the present invention is a lamp which is equipped with the semiconductor light-emitting element of the present invention, and therefore it is possible to achieve a sufficient decrease of a forward voltage (VF) even when high current is applied thereto, and also possible to achieve high output.

BEST MODE FOR CARRYING OUT THE INVENTION

Hereinafter, a semiconductor light-emitting element and a lamp of the present invention are described below in detail with references to drawings. Here, characterized portions may be appropriately modified in the drawings explained in the following description for the purpose of making the characteristics clearly understandable, and the size, ratio and the like of each portion may differ from the actual dimensional relationships thereof. Furthermore, the present invention is not limited to the following examples, and modifications, omission and additions may be made to the dimensions, numerical values, numbers, positions and the like within a scope that does not deviate from its intent.

(Semiconductor Light-Emitting Element)

Figure 1:
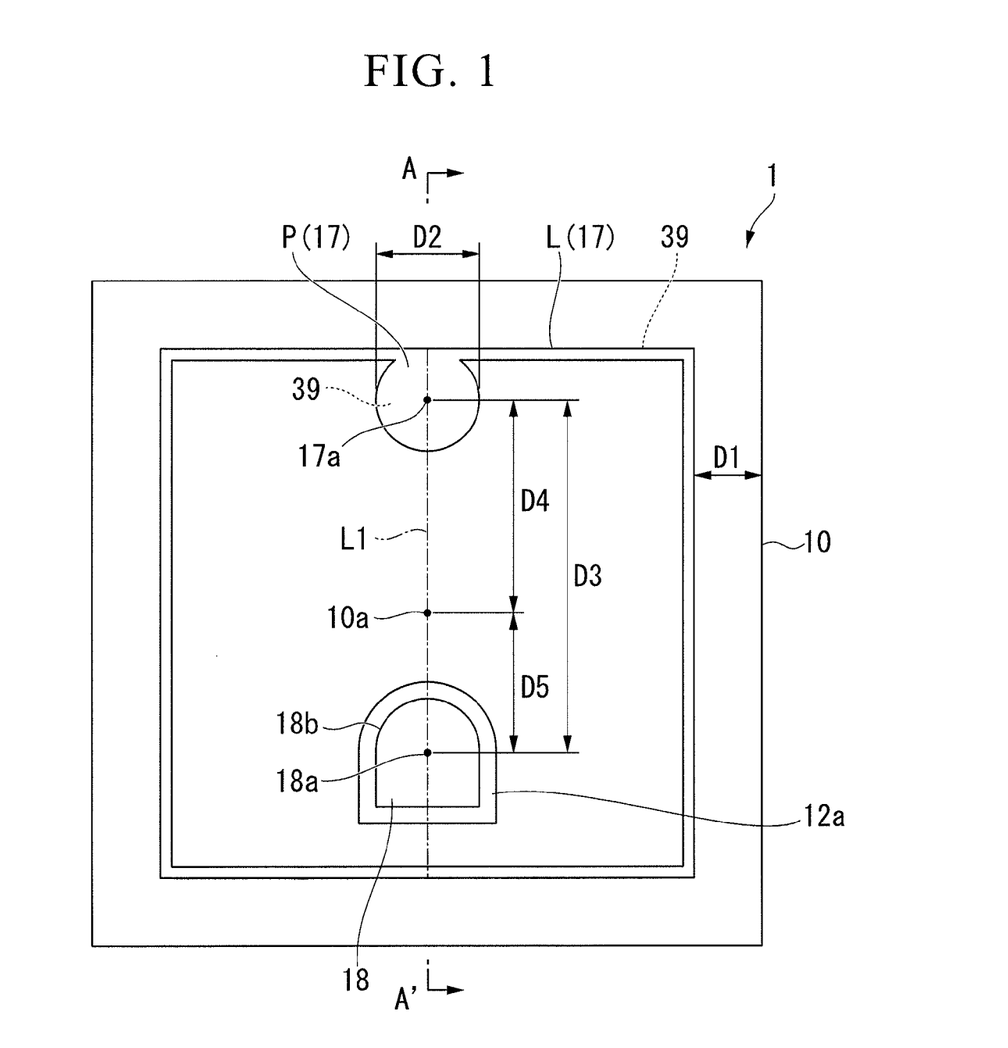
FIG. 1 shows a planar view of an example of a semiconductor light-emitting element of the present invention.
Figure 2:
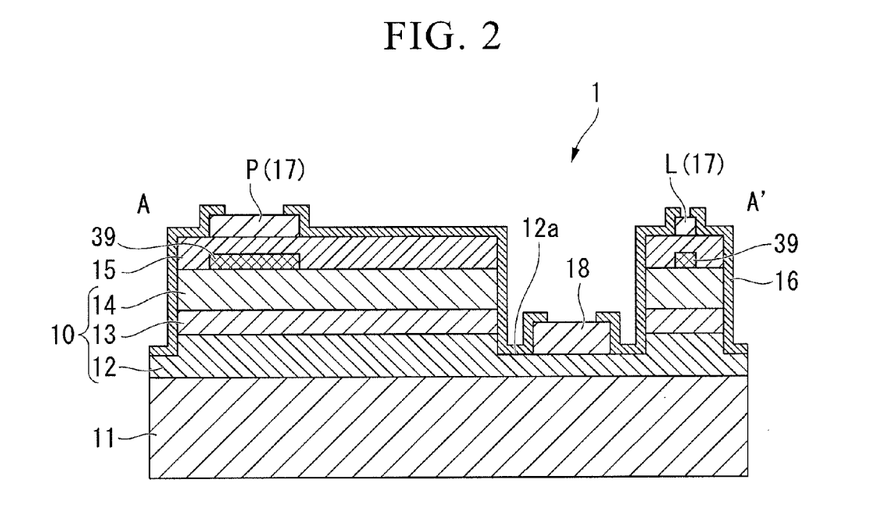
FIG. 2 shows a cross-sectional view at the line A-A' shown in FIG. 1.

FIG. 1 shows a planar view of an example of a semiconductor light-emitting element of the present invention. FIG. 2 shows a cross-sectional view at the line A-A' of the semiconductor light-emitting element shown in FIG. 1. The semiconductor light-emitting element 1 shown in FIGS. 1 and 2 is a face-up mount type semiconductor light-emitting element 1. The semiconductor light-emitting element 1 shown in FIGS. 1 and 2 comprises, on a substrate 11, a semiconductor layer 10 which includes an n-type semiconductor layer 12, a light-emitting layer 13 and a p-type semiconductor layer 14, an n-type electrode 18 which is provided on the exposed surface 12a of the n-type semiconductor layer 12, wherein the exposed surface has been exposed by removing a part of the semiconductor layer 10, a transparent conductive film 15 which is provided on the semiconductor layer 10, and a p-type electrode 17 which is provided on the transparent conductive film 15. Furthermore, a dielectric layer 39 (light-reflecting layer) is provided between the semiconductor layer 10 and the transparent conductive film 15 so that at least a part of the dielectric film overlaps with the p-type electrode 17 when they are observed in the planar view.

Furthermore, the semiconductor light-emitting element 1 shown in FIGS. 1 and 2 comprises a protective film 16 which is formed all over the area of the surface except for a center part of the n-type electrode 18 and a center part of the pad portion P of the p-type electrode 17.

Here, it should be noted that a protective film 16 is omitted in FIG. 1 in order to make the figure clearly understandable.

(Substrate)

As the substrate 11, materials used for conventional substrates can be used with no limitation such as oxide single crystals such as sapphire single crystal ($Al_2O_3$; A-plane, C-plane M-plane and R-plane), spinel single crystal ($MgAl_2O_4$), ZnO single crystal, $LiAlO_2$ single crystal, $LiGaO_2$ single crystal and MgO single crystal; boride single crystals such as $ZrB_2$; and Si single crystal, SiC single crystal, GaAs single crystal, AlN single crystal and GaN single crystal. Among the substrate materials, sapphire single crystal and SiC single crystal are particularly preferable for the substrate 11. The substrate 11 may be a processed substrate wherein irregularity is provided on at least a part of the surface thereof.

(Semiconductor Layer)

As shown in FIG. 2, on the substrate 11, a semiconductor layer 10 wherein an n-type semiconductor layer 12, a light-emitting layer 13 and a p-type semiconductor layer 14 are laminated is formed. It is preferable that refractive index of the semiconductor layer 10 be in a range of 1.9 to 2.6. When the refractive index of the semiconductor layer 10 is less than 1.9, the refractive index of the semiconductor layer 10 is less than that of a dielectric film 39. Therefore, the function of returning reflected light, which is emitted from the light-emitting layer 13, to the semiconductor layer 10 by reflecting the light by the dielectric film 39 may be obtained insufficiently, and the light may be absorbed by the p-type electrode 17. Accordingly, the effects of reducing the amount of light outputted from the light-emitting layer 13 may become insufficient. Furthermore, when the refractive index of the semiconductor layer 10 exceeds 2.6, materials which can be used for forming the semiconductor layer 10 are limited, and therefore there is a case that a suitable semiconductor layer is not obtained.

In the light-emitting element 1 of the present embodiment, it is preferable that the semiconductor layer 10 be composed of a GaN-based compound semiconductor. The refractive index of a GaN-based compound semiconductor is 2.4. As a GaN-based compound semiconductor, for example, semiconductor represented by $Al_XGa_YIn_ZN_{1-A}M_A$ ($0 \leq X \leq 1$, $0 \leq Y \leq 1$, $0 \leq Z \leq 1$, $X+Y+Z=1$; M represents a group V element which is different from nitrogen (N); and $0 \leq A < 1$) can be used.

In the semiconductor light-emitting element 1 of the present embodiment, between the substrate 11 and the n-type semiconductor layer 12, an intermediate layer (buffer layer) and a ground layer may be provided in this order from the side of the substrate 11.

The intermediate layer is preferably composed of polycrystalline represented by $Al_XGa_{1-X}N$ ($0 \leq X \leq 1$), and more preferably composed of single-crystal represented by $Al_XGa_{1-X}N$ ($0 \leq X \leq 1$). For example, the intermediate layer may be a layer of polycrystalline represented by $Al_XGa_{1-X}N$ ($0 \leq X \leq 1$), which has a thickness of 0.01 to 0.5 μm. The intermediate layer mitigates the difference in the grating constant between the substrate 11 and the ground layer, and serves to facilitate formation of a single crystal layer that is C-axis-aligned on the (0001) surface (the C-plane) of the substrate 11. Therefore, if a single crystal ground layer is laminated on the intermediate layer, it is possible to provide a ground layer having better crystallinity. Here, in the present invention, an intermediate layer is not an essential layer.

The ground layer is preferably composed of an $Al_xGa_{1-x}N$ layer ($0 \leq x \leq 1$, preferably $0 \leq x \leq 0.5$, and more preferably $0 \leq x \leq 0.1$). The ground layer is preferably an undoped layer ($< 1 \times 10^{17}/cm^3$). In the case where the ground layer is an undoped layer, excellent crystallinity can be obtained. When n-type impurities are contained in the ground layer, the concentration thereof is preferably in a range of $1 \times 10^{17}$ to $1 \times 10^{19}/cm$. There are no particular limitations on the n-type impurities that may be used in the ground layer, and for example, Si, Ge, and Sn and the like can be cited, and Si and Ge are preferable.

(N-Type Semiconductor Layer)

The n-type semiconductor layer 12 is preferably composed of an n-contact layer and an n-clad layer. It is also possible for the n-contact layer to double as the n-clad layer.

The n-contact layer is preferably composed of an $Al_xGa_{1-x}N$ layer ($0 \leq x \leq 1$, preferably $0 \leq x \leq 0.5$, and more preferably $0 \leq x \leq 0.1$). It is preferable that the n-contact layer be doped with an n-type impurity. It is also preferable that a concentration of the n-type impurity of the n-contact layer be $1 \times 10^{17}$ to $1 \times 10^{19}/cm^3$, and more preferably $1 \times 10^{18}$ to $1 \times 10^{19}/cm^3$ When a concentration of the n-type impurity of the n-contact layer is $1 \times 10^{17}$ to $1 \times 10^{19}/cm^3$, satisfactory ohmic contact can be retained with a negative electrode, cracks can be prevented and satisfactory crystallinity can be retained. There is no particular limitation on the n-type impurity of the n-contact layer, and examples of the n-type impurity include Si, Ge, Sn and the like. Si and Ge are preferable.

The n-clad layer is a layer which can fill a surface-unsmooth portion when there is such a surface-unsmooth portion on the uppermost layer of the n-contact layer. Due to the n-clad layer being provided, excellent surface smoothness can be obtained and therefore it is preferable. The n-clad layer may be formed with AlGaN, GaN, GaInN, or the like. In the present specification, a composition ratio of each element may be abbreviated, and may be simply described as AlGaN and GaInN. The n-clad layer may have a super-lattice structure wherein two or more compositions selected from these compositions are laminated plural times. The band gap of the n-clad layer is made larger than that of the light-emitting layer 13.

(Light-Emitting Layer)

As a GaN-based compound semiconductor which can be used for the light-emitting layer 13, $Ga_{1-s}In_sN$ (0<y<0.4) is cited. The film thickness of the light-emitting layer 13 is not limited in particular, and it is preferable to have a film thickness with which a quantum effect is achieved, that is, a film thickness which reaches a critical film thickness. Concretely, the film thickness of the light-emitting layer 13 is preferably 1 to 10 nm, more preferably 2 to 6 nm. When the film thickness of the light-emitting layer 13 is 1 to 10 nm, light output can be improved.

The light-emitting layer 13 may have a single quantum well (SQW) structure, or a multiple quantum well (MQW) structure. As the multiple quantum well (MQW) structure, for example, a structure is cited wherein well layers composed of $Ga_{1-s}In_sN$ (hereinafter, referred to a GaInN well layer) and barrier layers composed of $Al_cGa_{1-c}N$ (0≤c<0.3 and b>c) (hereinafter, referred to a $Al_cGa_{1-c}N$ barrier layer) are laminated alternatively can be cited. The well layers and/or the barrier layers which form the multiple quantum well (MQW) structure may be doped with impurity separately. Concretely, a Si-doped GaN barrier layer may be used as a barrier layer which constitutes the multiple quantum well (MQW) structure.

(P-Type Semiconductor Layer)

The p-type semiconductor layer 14 is preferably composed of a p-clad layer and p-contact layer. The p-contact layer may double as the p-clad layer.

The p-clad layer is a layer which has a composition which provides a larger bandgap energy than the light-emitting layer 13, and can confine carriers in the light-emitting layer 13. For example, a p-clad layer can be cited which is made of $Al_dGa_{1-d}N$ (0≤d≤0.4, preferably 0.1≤d≤0.3) is cited. The p-clad layer can be formed with AlGaN, GaN and the like. The p-clad layer may have a super-lattice structure wherein two or more compositions selected from these compositions are laminated plural times.

The p-type doping concentration of the p-clad layer is preferably $1\times10^{18}$ to $1\times10^{21}/cm^3$, and more preferably $1\times10^{19}$ to $1\times10^{20}/cm^3$. When the p-type doping concentration of the p-clad layer is within the range of $1\times10^{18}$ to $1\times10^{21}/cm^3$, it is possible to obtain a satisfactory p-type crystal without deteriorating crystallinity.

It is preferable that, as the p-contact layer, a GaN-based compound semiconductor which includes $Al_eGa_{1-e}N$ (0≤e<0.5, preferably 0≤e≤2 and more preferably 0≤e≤0.1) be used. When the Al composition of $Al_eGa_{1-e}N$ is 0≤e≤0.5, satisfactory crystallinity can be retained and satisfactory ohmic contact with a p-ohmic electrode can be achieved. It is preferable that the p-contact layer contain a p-type dopant at a concentration of $1\times10^{18}$ to $1\times10^{21}/cm^3$, and more preferably $5\times10^{19}$ to $5\times10^{20}/cm^3$. When a concentration of the p-type dopant included in the p-contact layer is $1\times10^{18}$ to $1\times10/cm^3$, it is possible to retain satisfactory ohmic contact, prevent cracks and retain satisfactory crystallinity. There is no particular limitation on the p-type dopant (p-type impurity), and examples thereof include Mg.

(Transparent Conductive Film)

As shown in FIG. 2, a transparent conductive film 15 is provided on the p-type semiconductor layer 14 of the semiconductor layer 10. As shown in FIGS. 1 and 2, the transparent conductive film 15 may be preferably formed so as to cover almost the entire surface of the p-type semiconductor layer 14 in order to uniformly diffuse current over the entire surface of the p-type semiconductor layer 14, or may be formed in a grid-like or ramified manner with interstitial openings.

In order to efficiently extract light from the light-emitting layer 13 to the exterior of the semiconductor light-emitting element 1, it is preferable that the transparent conductive film 15 have excellent light transmission properties. In addition, in order to uniformly diffuse current over the entire surface of the p-type semiconductor layer 14, it is preferable that the transparent conductive film 15 have excellent conductivity.

Furthermore, a refractive index of the transparent conductive film 15 is preferably in a range of 1.9 to 2.2. When the refractive index of the transparent conductive film 15 is less than 1.9, the refractive index of the transparent conductive film 15 is less than that of a dielectric film 39, and the effect provided by the dielectric film 39 which decreases the amount of light absorbed by the p-type electrode 17 may not be obtained, wherein the light is emitted from a light-emitting layer 13. Furthermore, when the refractive index of the transparent conductive film 15 exceeds 2.2, alternative materials used for forming the transparent conductive film 15 decrease and therefore it is unpreferable.

Resistivity of the transparent conductive film 15 is preferably in a range of $10^{-5}$ to $10^{-1}$ Ω·cm. When the resistivity of the transparent conductive film 15 is in the above range, it is possible to uniformly and effectively diffuse current over the p-type semiconductor layer 14. Furthermore, although it is preferable that the resistivity of the transparent conductive film 15 be as low as possible, when the resistivity is less than the above range, alternative materials used for forming the transparent conductive film 15 decrease.

Examples of materials of the transparent conductive film 15 include at least one kind of a transparent conductive material, which is at least one kind selected from the group consisting of zinc sulfide, chromium sulfide, and conductive oxides including any one kind of In, Zn, Al, Ga, Ti, Bi, Mg, W and Ce. For example, as the conductive oxide, ITO (indium tin oxide ($In_2O_3$—$SnO_2$)), IZO (indium zinc oxide ($In_2O_3$—ZnO)), AZO (aluminum zinc oxide (ZnO—$Al_2O_3$)), GZO (gallium zinc oxide (ZnO—$Ga_2O_3$)), fluorine-doped tin oxide, titanium oxide and the like can be cited.

Among them, ITO and IZO are preferably used since they have superior light transparency and electrical conductivity, and achieve sufficient refractive index difference with respect to a dielectric film 39. A refractive index of ITO and IZO is in a range of 2 to 2.2.

A thickness of the transparent conductive film 15 is preferably 35 nm to 2000 nm, more preferably 50 nm to 1000 nm and most preferably 100 nm to 500 nm. When the thickness of the transparent conductive film 15 is less than 35 nm, current diffuse efficiency becomes insufficient, and therefore sufficient electrical conductivity may not be obtained. When the thickness of the transparent conductive film 15 exceeds 2000 nm, transmission coefficient decreases, light extraction efficiency decreases and the output of a semiconductor light-emitting element 1 may become insufficient. When the thickness of the transparent conductive film 15 is in a range of 35 to 2000 nm, suitable electrical conductivity is obtained and therefore a semiconductor light-emitting element 1 can be obtained which has low drive voltage and excellent light extraction efficiency.

(Dielectric Layer)

The dielectric layer 39 is composed of a dielectric material which reflects light, and acts as a light-reflecting layer which reflects light emitted from the semiconductor layer 10. Here, in the present embodiment, an explanation is given using an example wherein a dielectric layer 39 composed of an insulating material is provided. However, instead of the dielectric layer 39, it is possible to use a layer composed of a material which reflects light wherein the layer acts merely as a light-reflecting layer.

The dielectric layer 39 is provided between the semiconductor layer 10 and the transparent conductive film 15 as shown in FIG. 2, and is provided at an area where the layer overlaps with a p-type electrode 17 when it is observed in the planar view. Here, the dielectric layer 39 can be provided so that at least a part thereof overlaps with the p-type electrode 17 when it is observed in the planar view. For example, a planar shape of the dielectric layer 39 may have a shape which is the same as a planar shape of the p-type electrode 17, a shape which is larger than the p-type electrode 17 so that a planar shape of the dielectric layer 39 surrounds that of the p-type electrode 17 and the outline of dielectric layer 39 exists apart from the outline of the p-type electrode 17 to the outside at the predetermined distance, or a shape which is smaller than the p-type electrode 17 so that the outline of dielectric layer 39 exists apart from the outline of the p-type electrode 17 to the inside at the predetermined distance.

However, when the form of the dielectric layer 39 is too large, due to the insulation effect of the dielectric layer 39, output may become insufficient since area, which does not act as the light-emitting layer 13, increases in the light-emitting layer 13 which constitutes the semiconductor layer 10. Furthermore, when the form of the dielectric layer 39 is too small, the effect obtained by providing the dielectric layer 39 may be insufficiently obtained.

Accordingly, a planar shape of the dielectric layer 39 is preferably set so that the area of the dielectric layer 39 is in a range of 30% to 200% based on the area of the p-type electrode 17, more preferably in a range of 70% to 150%, and still more preferably in a range of 80% to 130. When the area of the dielectric layer 39 is less than 30% of the area of the p-type electrode 17, function may be insufficiently obtained wherein the emitted light is reflected by the dielectric layer 39 to decrease the light absorbed by the p-type electrode 17. When the area of the dielectric layer 39 exceeds 200% of the area of the p-type electrode 17, current which is injected to the light-emitting layer 13 via the transparent conductive film 15 may be limited. It is preferable that at least 30% or more of the area of the p-type electrode 17 overlap with the dielectric layer 39.

The refractive index of the dielectric layer 39 is preferably less than the refractive index of the transparent conductive film 15 and the semiconductor layer 10, and it is concretely preferable that refractive index of the dielectric layer be less than 1.9. When the refractive index of the dielectric layer 39 exceeds the refractive index of the transparent conductive film 15 and the semiconductor layer 10, function may be obtained insufficiently wherein light emitted from the semiconductor layer 10 is reflected by the dielectric layer 39 to decrease the absorbed light which is absorbed by the p-type electrode 17. Furthermore, when the refractive index of the dielectric layer 39 is less than 1.9, it is possible to sufficiently increase the difference between the refractive index of the dielectric layer 39 and the refractive index of the transparent conductive film 15 and the semiconductor layer 10. As a result, it is possible to reflect light emitted from the semiconductor layer 10 efficiently, and it is also possible to prevent light emitted from the semiconductor layer 10 from being absorbed in the p-type electrode 17.

In the present embodiment, materials usable for the dielectric layer 39 are not particularly limited as long as they are insulating materials which can reflect light, and it is preferable that the layer be composed of $SiO_2$ wherein refractive index is 1.48. When the dielectric layer 39 is composed of $SiO_2$, it is possible to inhibit light, which is emitted from the semiconductor layer 10 to the transparent conductive film 15 and is absorbed in the p-type electrode 17, more effectively, due to the reflection effect of the dielectric layer 39 and the insulating effect between the transparent conductive film 15 and the p-type semiconductor layer 14.

(P-Type Electrode)

The p-type electrode 17 is composed of a pad portion P, which is used as a bonding pad and has a circular structure when the portion is observed in the planar view, and a linear portion L, which linearly extends from the pad portion P and has an annular structure when the linear portion is observed in the planar view.

In the present embodiment, as shown in FIG. 1, the pad portion P is provided in vicinity of an edge portion of the semiconductor layer 10, wherein the semiconductor layer 10 has a form of a rectangle when it is observed in planar view, so that the pad portion exists at the middle of any side in the length direction which forms the semiconductor layer 10. When arrangement of the pad portion P on the transparent conductive film 15 is set as shown in FIG. 1, it is possible to increase the distance D3 between the pad portion P and the n-type electrode 18 easily and sufficiently, and uniformity of current diffusion at the transparent conductive film 15 becomes excellent.

Here, arrangement of the pad portion P on the transparent conductive film 15 is not limited in particular. For example, the pad portion may be provided at the vicinity of one of four apexes of the semiconductor layer 10 which has a form of a rectangle in the planar view. In such a case, it is possible to further increase the distance between the pad portion P and the n-type electrode 18, and uniformity of current diffusion at the transparent conductive film 15 becomes excellent.

Furthermore, it is preferable that the pad portion P have a circular form in the planar view as shown in FIG. 1, since operation can be performed easily when wide bonding is performed, even if the pad portion has small area. Here, it is preferable that the pad portion P has a circular form, but is not limited thereto. For example, the pad portion may have the polygonal form, and also have the structure wherein a part of circular outline and a part of polygonal outline are combined. When the planar form of the pad portion P is not a circle in the planar view, it is preferable that a part of the pad portion P, which faces the n-type electrode 18, be a curved part (protruded form) protruding toward the side, where the n-type electrode 18 exists, in the planar view. When the pad portion P includes such a part, which faces the n-type electrode 18 and is curved so that it protrudes toward the side where the n-type electrode 18 exists, in the planar view, uniformity of current diffusion becomes still more excellent at the transparent conductive film 15.

A linear portion L is provided along four sides of the semiconductor layer 10, which has a form of a rectangle when it is observed in planar view, so that the linear portion exists apart from the edge of the semiconductor layer 10 to the inner side at the predetermined distance (distance shown as "D1" in FIG. 1), and the planar form of the linear portion L is roughly similar to the external form of the semiconductor layer 10. Furthermore, in the present embodiment, the linear portion L is provided so that it is a continuous line. However, the linear portion may be partially separated.

When the distance D1 between an outer edge of the linear portion L of the p-type electrode and an edge of the semiconductor layer 10 (for example, a cross-section of a semiconductor light-emitting element 1 (cross-section of a substrate)) is too small, the outer edge of the linear portion L exists near to the cross-section of the semiconductor light-emitting element 1, and it is difficult to form the linear portion L. When the distance D1 between an outer edge of the linear portion L and an edge of the semiconductor layer 10 is too large, light emission output tends to decrease at an area between an edge of the semiconductor layer 10 and the linear portion L which exists far from the n-type electrode 18. Accordingly, although the distance D1 between an outer edge of the linear portion L and an edge of the semiconductor layer 10 is not limited in particular, the distance is preferably in a range of 20 µm to 200 µm, and more preferably in a range of 30 µm to 120 µm.

Furthermore, when the width of the linear portion L is too narrow, it may be difficult to use a mask process (lithography process) at the time of forming the linear portion L, or to form the linear portion L by sputtering. Furthermore, when the width of the linear portion L is too thick, deterioration of light emission output achieved by the linear portion L increases. Accordingly, although the width (breadth) of the linear portion L of the p-type electrode 17 is not limited in particular, the thickness is preferably in a range of 0.1 µm to 20 µm, and more preferably in a range of 1 µm to 15 µm.

For the p-type electrode 17, various structures using conventional materials such as Au, Al, Ni, Cu, and the like can be used without any limitations, such as a three-layered structure which is composed of a metal reflecting layer composed of Al, a barrier layer composed of Ti and a bonding layer composed of Au. It is preferable that the thickness of the p-type electrode 17 be within a range of 100 nm to 40 µm, and more preferably 300 nm to 10 µm. When t the thickness of the p-type electrode 17 is 100 nm or more, bondability can be increased as a bonding pad. When the thickness of the p-type electrode 17 is not more than 40 µm, it is possible to decrease production costs.

(N-Type Electrode)

As shown in FIG. 1, the n-type electrode 18 exists in an inner area, which is surrounded by the linear portion L of the P-type electrode 17, and exists on a straight line L1 which goes through the center 10a of the semiconductor layer 10 and the center 17a of the pad portion P of the P-type electrode 17 in a planar view. Furthermore, the distance D3 between the center 18a of the n-type electrode 18 and the center 17a of the pad portion is greater than or equal to the distance D4 between the center 17a of the pad portion P and the center 10a of the semiconductor layer 10.

In the present embodiment, planar view of the n-type electrode 18 has a structure wherein a part of circular outline and a part of square outline are combined. A part of the n-type electrode 18, which faces a pad portion P of the p-type electrode 17, is a curved part 18b which is an arc protruding toward the side where the pad portion P exists when it is observed in planar view. Another part of the n-type electrode 18 has an almost rectangular structure wherein each side is provided along the external structure of the rectangular semiconductor layer 10. It is preferable that a radius of an arc which forms the curved part 18b of the n-type electrode 18, which faces the pad portion P of the p-type electrode 17, be the same as a radius of a circle of the pad portion P. In the present embodiment, the planar view of the n-type electrode 18 has a combined structure wherein a circle in which a center 18a is provided and a square which circumscribes the circle are combined.

Here, it is preferable that the planar form of the n-type electrode 18 be as shown in FIG. 1. However, it is not limited to the form shown in FIG. 1, and other forms such as a circle or a polygon are acceptable.

Furthermore, the n-type electrode 18 is formed on an exposed surface 12a of the n-type semiconductor layer 12 as shown in FIGS. 1 and 2. The size and form of the planar form of the exposed surface 12a is not limited in so far as the n-type electrode 18 can be provided thereon. However, when the area of the exposed surface 12a becomes large until it exceeds the required level, the area of the light-emitting layer 13 becomes small, and output may become insufficient. Accordingly, as shown in FIG. 1, it is preferable that the planar form of the exposed surface 12a be similar to that of the n-type electrode 18 and be one size larger than that of the n-type electrode 18, and the size of the exposed surface 12a be minimized as small as possible in so far as the n-type electrode 18 is provided thereon.

Furthermore, as shown in FIGS. 1 and 2, when the n-type electrode 18 is formed on the exposed surface 12a of the n-type semiconductor layer 12, the n-type electrode 18 bonds with the n-type semiconductor layer 12 and can be used as a bonding pad. As the n-type electrode 18, any well-known conventional compositions and structures, such as, for example, a double-layer structure wherein a Ti film and Au film are laminated from the side of the exposed surface 12a, can be used without limitation.

Furthermore, in the present embodiment, as shown in FIG. 1, the n-type electrode 18 and a pad portion P of the p-type electrode 17 have planar forms which are different from each other. It is preferable that the n-type electrode 18 and the pad portion P of the p-type electrode 17 have different forms, since it is possible to distinguish the n-type electrode 18 from the pad portion P of the p-type electrode 17 easily and to prevent efficiently incorrect wire bonding wherein the n-type electrode 18 and the pad portion P of the p-type electrode 17 are bonded incorrectly.

Here, although it is preferable that the n-type electrode 18 and the pad portion P of the p-type electrode 17 have different forms to each other as shown in FIG. 1, it is also possible that they have the same planar form.

Furthermore, when the pad portion P of the p-type electrode 17 has a circular form in the planar view and a planar form of the n-type electrode 18 is different from that of the pad portion P of the p-type electrode 17, it is preferable that a curved part 18b be provided which protrudes toward the side where the pad portion P of the p-type electrode 17 exists when it is observed in planar view as shown in FIG. 1. In this case, it is possible to further improve uniformity of current diffusion at the transparent conductive film 15.

The n-type electrode 18 and the p-type electrode 17 may be composed of the same materials or different materials. When the p-type electrode 17 and the n-type electrode 18 are composed of the same materials, for example, such a structure is usable wherein a five-layer structure is formed by laminating the first layer composed of Au, the second layer composed of Ti, the third layer composed of Al, the fourth layer composed of Ti and the fifth layer composed of Au.

(Protective Film)

A protective film 16 is formed to cover the surface except the center portions of the pad portion P of the p-type electrode 17 and the n-type electrode 18 formed on the transparent conductive film 15, prevents moisture or the like from penetrating into the semiconductor light-emitting element 1, and prevents deterioration of the semiconductor light-emitting element 1. As the protective film 16, an insulating transparent film can be used. Concretely, it is preferable that the protective film 16 be composed of a material including $SiO_2$.

Here, it is preferable that the protective film 16 be provided to prevent deterioration of the semiconductor light-emitting element 1, but it is also possible to not be provided.

Furthermore, the size and form of the semiconductor light-emitting element 1 of the embodiment can be selected optionally. For example, it is preferable that the light-emitting element be a middle to large-sized chip wherein it is a rectangle (square or rectangle) when it is observed in planar view and the side length of the semiconductor layer 10 be in a range of 450 μm to 1.5 mm, and more preferably 450 μm to 600 μm.

In the present embodiment, it is preferable that the semiconductor layer 10 be a rectangle having side lengths in a range of 450 μm to 600 μm in the planar view, and, as shown in FIG. 1, a distance D1 between an outer edge of the linear portion L of the p-type electrode 17 and an edge of the semiconductor layer 10 be in a range of 30 to 120 μm, and a pad portion P of the p-type electrode 17 be a circle having diameter (shown as "D2" in FIG. 1) of 60 to 120 μm in the planar view, distance D5 between the center 18a of the n-type electrode 18 and the center 10a of the semiconductor layer 10 is in a range of 0 to 120 μm, and the thickness (width) of the linear portion L of the P-type electrode 17 be in a range of 5 to 12 μm.

When the size of the semiconductor light-emitting element 1 is within the range described above, current flow at the transparent conductive film 15 can be controlled more efficiently, wherein the current flow is determined by a ratio of the areas where the p-type electrode 17 and the n-type electrode 18 are provided with respect to the area of the upper surface of the semiconductor layer 10 and by the arrangement and position of the p-type electrode 17 and the n-type electrode 18, and therefore, uniformity of current diffusion at the transparent conductive film 15 becomes more excellent.

Here, when the distance D1 between an outer edge of the linear portion L of the p-type electrode 17 and an edge of the semiconductor layer 10 is less than the aforementioned range, drive voltage may increase. When a distance D1 exceeds the aforementioned range, light emitted from the light-emitting layer 13 which is provided between a linear portion L of the P-type electrode 17 and an edge of the semiconductor layer 10 in the plan view may decrease and therefore output may become insufficient.

Furthermore, a diameter D2 of a pad portion P of the p-type electrode 17 is less than the aforementioned range, problems may be caused when wire bonding is performed. Furthermore, when a diameter D2 of a pad portion P of the p-type electrode 17 exceeds the aforementioned range, the amount of light which is emitted from the light-emitting layer 13 and is absorbed by the p-type electrode 17 increases to cause insufficient output (a light-emitting output (Po)), although the driving voltage (forward voltage: Vf) decreases.

Furthermore, when a distance D5 between the center 18a of the n-type electrode 18 and the center 10a of the semiconductor layer 10 is less than the aforementioned range (in the present invention, it means that the center 18a of the n-type electrode 18 is provided closer to the pad portion P of the p-type electrode 17 than the center of the semiconductor layer 10), insufficient output may be caused since an area where current flows insufficiently in an in-plane of the transparent conductive film 15 tends to be formed, although the driving voltage (forward voltage: Vf) decreases. Furthermore, when a distance D5 between the center 18a of the n-type electrode 18 and the center 10a of the semiconductor layer 10 exceeds the aforementioned range, nonuniformity of current diffusion in an in-plane of the transparent conductive film 15 increases and uniform light emission is hard to be obtained, even if sufficient output (a light-emitting output (Po)) may be obtained.

Furthermore, when the width of a linear portion L of the p-type electrode 17 is less than the aforementioned range, the effect of decreasing the driving voltage (forward voltage: Vf) provided by the linear portion L becomes insufficient. Furthermore, when the width of a linear portion L of the p-type electrode 17 exceeds the aforementioned range, the amount of light which is emitted from the light-emitting layer 13 and is absorbed by the p-type electrode 17 increases to cause insufficient output.

(Manufacturing Method of Semiconductor Light-Emitting Element)

Next, a manufacturing method of a semiconductor light-emitting element of the present invention is explained using, as an example, a manufacturing method of a semiconductor light-emitting element 1 shown in FIGS. 1 and 2.

In order to manufacture the semiconductor light-emitting element 1 shown in FIGS. 1 and 2, first, a semiconductor layer 10, wherein an n-type semiconductor layer 12, a light-emitting layer 13 and p-type semiconductor layer 14 are laminated in this order, is provided on a substrate 11. Here, between the substrate 11 and the n-type semiconductor layer 12, an intermediate layer and a ground layer may be provided in this order from the side of the substrate 11.

The method of forming the semiconductor layer 10 is not limited in particular, and for example, a MOCVD (a metalorganic chemical vapor deposition method), a HVPE (a hydride vapor phase epitaxy method), a MBE (a molecular beam epitaxy method) and the like can be employed.

When the semiconductor layer 10 is made of a GaN-based compound semiconductor, a MOCVD method is preferably used from the viewpoint of the controllability of the film thickness and mass productivity.

When the MOCVD method is used as a method of forming a GaN-based compound semiconductor, hydrogen ($H_2$) or nitrogen ($N_2$) can be used as a carrier gas, and trimethylgallium (TMG) or triethylgallium (TEG) can be used as a source of Ga which is a group III raw material, trimethylaluminum (TMA) or triethylaluminum (TEA) can be used as a source of Al, trimethylindium (TMI) or triethylindium (TEI) can be used as a source of In, and ammonia ($NH_3$), hydrazine ($N_2H_4$) or the like can be used as a source of N, which is a group V raw material.

In addition, when a GaN-based compound semiconductor is formed using the MOCVD method, as n-type dopant, monosilane ($SiH_4$) or disilane ($Si_2H_6$) can be used as a Si source material, and germane gas ($GeH_4$) or an organogermanium compound such as tetramethyl germanium ($((CH_3)_4Ge)$) or tetraethyl germanium ($((C_2H_5)_4Ge)$) can be used as a Ge source material.

Furthermore, as p-type dopant, biscyclopentadienyl magnesium ($Cp_2Mg$) or bisethylcyclopentadienyl magnesium (EtCp2Mg) can be used as a Mg source material.

Furthermore, when the MBE method is used as a method of forming the GaN-based compound semiconductor, elemental germanium can be used as n-type dopant.

Next, by using a commonly known photolithography technique, a dielectric layer 39 is provided by a sputtering method or a CVD method at an area which corresponds to the planar form of the p-type electrode 17 provided on the p-type semiconductor layer 14.

Next, on the semiconductor layer 10 on which the dielectric layer 39 has been provided, a transparent conductive film 15 having a predetermined form is provided using a commonly known photolithography technique.

Next, using a commonly known photolithography technique, a predetermined part of the semiconductor layer 10 on which the dielectric layer 39 and the transparent conductive film 15 have been formed is removed by etching to provide an exposed surface 12a, which has a predetermined form, of the n-type semiconductor layer 12 as a position where an n-type electrode 18 is provided. Then, an n-type electrode 18 having a predetermined form is provided on the exposed surface 12a of the n-type semiconductor layer 12.

Subsequently, the p-type electrode 17 having the predetermined form is formed at the predetermined position on the transparent conductive film 15.

Next, a protective film 16 is formed. It is preferable that the protective film 16 be formed all over the surface except for a center part of the n-type electrode 18 and a center part of the pad portion P of the p-type electrode 17 using a commonly known photolithography technique and lift-off technique with a film forming method such as a sputtering method or a CVD method wherein a fine film can be formed. It is particularly preferable that a CVD method, wherein a fine film can be formed, be used as a method of forming the protective film 16.

Subsequently, the substrate 11 on which the protective film 16 has been formed is divided (chipped) to obtain the semiconductor light-emitting element 1 shown in FIGS. 1 and 2.

In the semiconductor light-emitting element 1 of the present embodiment, a dielectric layer 39 is provided between the semiconductor layer 10 and the transparent conductive film 15 so that at least a part of the dielectric film overlaps with the p-type electrode 17 when they are observed in the planar view, and the P-type electrode 17 is composed of the pad portion P and the linear portion L, which linearly extends from the pad portion P and has an annular structure when it is observed in the planar view. Furthermore, the n-type electrode 18 exists in an inner area, which is surrounded by the linear portion L of the P-type electrode 17, and exists on a straight line L1 which goes through the center 10a of the semiconductor layer 10 and the center 17a of the pad portion P of the P-type electrode 17 in the planar view. The distance D3 between the center 18a of the n-type electrode 18 and the center 17a of the pad portion P is greater than or equal to the distance D4 between the center 17a of the pad portion P and the center 10a of the semiconductor layer 10. Accordingly, due to the presence of the dielectric layer 39, it is possible to decrease the amount of light efficiently, which is emitted from the light-emitting layer 13 and is absorbed by the p-type electrode 17, and uniformity of current diffusion at the transparent conductive film 15 becomes excellent. As a result, the forward voltage (Vf) can be sufficiently decreased even if high current is applied, and high output can be achieved.

Furthermore, in the semiconductor light-emitting element 1 of the present embodiment, the dielectric layer 39 has a reflection effect. Therefore, reflected light, which is reflected by the dielectric layer 39 and returned to the semiconductor layer 10, is multiply reflected in the semiconductor layer 10, subsequently the light passes through the transparent conductive film 15 as light having high straightness, for example, as light wherein an angle between the light and the thickness direction of the semiconductor light-emitting element 1 is ±30° or less, and the light is finally emitted. As a result, in the semiconductor light-emitting element 1 of the present embodiment, it is possible to obtain excellent light extraction efficiency and high output.

(Lamp)

Next, a lamp of the present invention is explained using, as an example, a lamp equipped with the semiconductor light-emitting element 1 shown in FIGS. 1 and 2.

Figure 3:
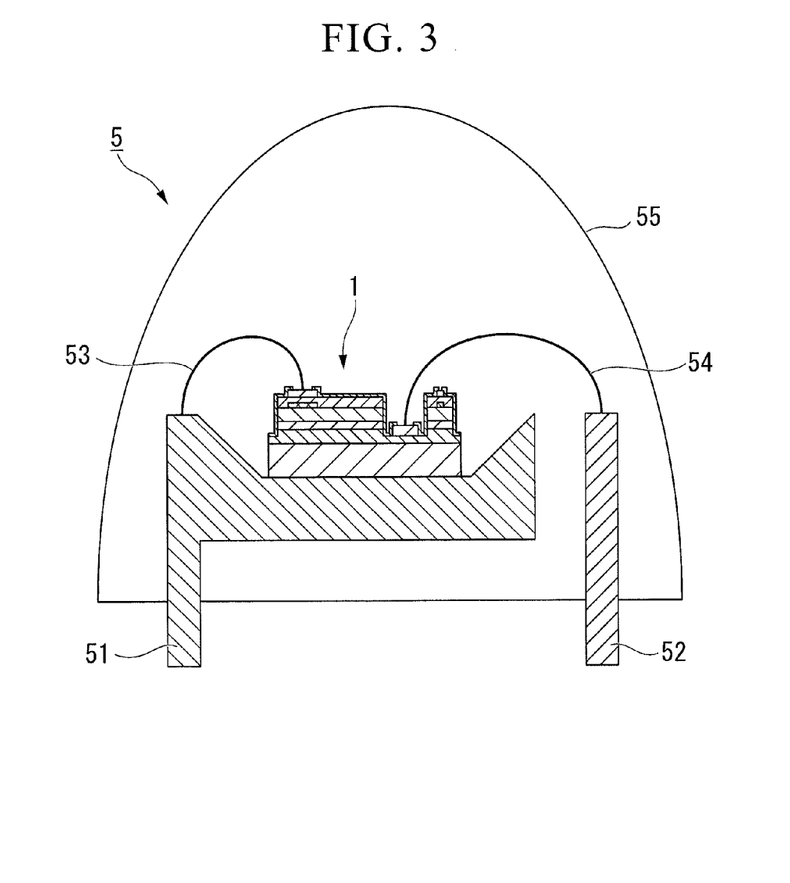
FIG. 3 shows a schematic cross-sectional view of an example of a lamp of the present invention.

FIG. 3 is a cross-sectional schematic view showing one example of a lamp of the present invention. In the lamp 5 (LED lamp) shown in FIG. 3, the semiconductor light-emitting element 1 shown in FIGS. 1 and 2 is bonded by wires 53 and 54 to frames 51 and 52, and is sealed with a mold 55 made of a transparent resin to have a bullet-shape.

The lamp 5 of the present embodiment can be manufactured using the semiconductor light-emitting element 1 shown in FIGS. 1 and 2, for example, by the method described below.

First, the semiconductor light-emitting element 1 is bonded to one (frame 51 in FIG. 3) of two frames 51 and 52 using a resin or the like. Next, a pad portion P of the p-type electrode 17 and the n-type electrode 18 of the semiconductor light-emitting element 1 are respectively bonded to frames 51 and 52 using wires 53 and 54 which are made of gold or the like, to mount the light-emitting element 1. Subsequently, a method or the like can be performed wherein the periphery of the semiconductor light-emitting element 1 is sealed with a mold 55 to form a lamp 5.

Here, a lamp of the present invention is not limited to the lamp 5 shown in FIG. 3. For example, a lamp of the present invention may be a lamp which emits white light by color mixing of color of the semiconductor light-emitting element 1 and colors of fluorescent materials.

Furthermore, a lamp of the present invention may be bullet-shaped lamps for general applications, side view lamps for portable backlight applications, top view lamps used in display equipment or the like.

The lamp 5 of the present embodiment includes the semiconductor light-emitting element 1 shown in FIGS. 1 and 2, and therefore a lamp can be obtained which has a sufficiently low forward voltage (Vf) even if high current is applied, and can achieve high output.

Furthermore, electronic devices which are equipped with the lamp 5 of the present embodiment such as a backlight, a cell phone, a display, various panels, a computer, a game machine and an illumination lamp, and mechanical devices such as an automobile equipped with the electronic device, can be used as a device which includes the semiconductor light-emitting element 1 which can achieve high light-emitting output. It is particularly preferable that the lamp be used in the battery-powered electronic devices such as a backlight, a cell phone, a display, a game machine and an illumination lamp, since excellent products equipped with the semiconductor light-emitting element 1 which can achieve high light-emitting output can be provided.

EXAMPLES

The present invention will be described in further detail with reference to Examples, but it should be understood that the present invention is by no means restricted to the following Examples.

Example 1

A semiconductor light-emitting element 1 shown in FIGS. 1 and 2 was manufactured by the method described below.

First, on a substrate 11, a buffer layer composed of AlN was formed by the conventionally known method wherein sputtering was used. Then, a ground layer composed of undoped GaN, an n-type contact layer composed of Si-doped n-type GaN and an n-type clad layer composed of $In_{0.03}Ga_{0.97}N$ were laminated by the conventional MOCVD method to form an n-type semiconductor layer 12.

Next, on the n-type semiconductor layer 12, the barrier layer composed of $Al_cGa_{1-c}N$ and the well layer composed of GaInN were alternately laminated six times and finally the barrier layer composed of $Al_cGa_{1-c}N$ was further laminated to provide a light-emitting layer 13 of a multiple quantum well structure.

Subsequently, on the light-emitting layer 13, a p-cladding layer composed of Mg-doped AlGaN and a p-contact layer composed of Mg-doped p-type GaN were laminated to form a p-type semiconductor layer 14.

In this way, a semiconductor layer 10 which consisted of the n-type semiconductor layer 12, the light-emitting layer 13 and the p-type semiconductor layer 14 formed on the substrate 11 and had refractive index of 2.4 was obtained.

Next, on the p-type semiconductor layer 14, a dielectric layer 39 composed of $SiO_2$ (refractive index: 1.45) having a thickness of 170 nm was formed on an area corresponding to the planar form of a p-type electrode 17 which was intended to be provided on the p-type semiconductor layer 14 by the sputtering method. Here, the dielectric layer 39 which overlaps with the pad portion P of the p-type electrode 17 when it was observed in planar view has the same shape as that of the pad portion P, and the width (breadth) of a part of the dielectric layer 39 wherein the part overlaps with the linear portion L of the P-type electrode 17 was set to 14 μm.

Next, a transparent conductive film 15 composed of ITO (refractive index: 2.0, resistivity: $1 \times 10^{-4}$ Ω·cm) having a thickness of 250 nm was formed on the semiconductor layer 10 on which the dielectric layer 39 was provided.

Subsequently, patterning was performed by a photolithography technique so that a predetermined area of the semiconductor layer 10 (the p-type semiconductor layer 14, the light-emitting layer 13 and the n-type semiconductor layer 12) was subjected to etching to expose an exposed surface 12a of the n-type semiconductor layer 12 in a region where a predetermined region at which the n-type electrode 18 should be provided was included.

Next, on the exposed surface 12a of the n-type semiconductor layer, an n-type electrode 18 was formed. Subsequently, a p-type electrode 17 was formed on the transparent conductive film 15.

Here, the n-type electrode 18 was provided in an inner area, which was surrounded by the linear portion L of the P-type electrode 17 and existed on a straight line L1 which went through the center 10a of the semiconductor layer 10 and the center 17a of the pad portion P of the P-type electrode 17 in the planar view, and a distance between the center 18a of the n-type electrode 18 and the center 10a of the semiconductor layer 10 was 0 μm (that is, a center of the n-type electrode and a center of the semiconductor layer were identical).

Furthermore, the planar form of the n-type electrode 18 had a curved part 18b, which was an arc protruding toward the side where the pad portion P existed when it was observed in planar view and was a part which faced the pad portion P of the p-type electrode 17 of the p-type electrode 18. Other part of the n-type electrode 18 was an almost rectangular structure wherein each side was provided along the external structure of the rectangular semiconductor layer 10. The curved part 18b of the n-type electrode 18, which faces the pad portion P of the p-type electrode 17, was a semicircle having a radius which was the same as a radius of a circle of the pad portion P.

Furthermore, a p-type electrode 17 was formed such that it included a pad portion P, which had the same planar form with that of the dielectric layer 39, overlapped with the dielectric layer 39 in the planar view and had a circular structure having a diameter of 90 μm ("D2" shown in FIG. 1) in the planar view, and a linear portion L, which linearly extended from the pad portion P and had an annular structure in the planar view. Here, the linear portion L was formed so that the distance D1 between an outer edge of the linear portion L and an edge of the semiconductor layer 10 was 36 μm, and width of the linear portion L was 4 μm.

Furthermore, the p-type electrode 17 was formed so that it was a three-layered structure wherein the first layer composed of tantalum nitride, the second layer composed of Pt and the third layer composed of Au were laminated in this order.

The n-type electrode 18 was formed so that it was a three-layered structure wherein the first layer composed of Al, the second layer composed of Ti and the third layer composed of Au are laminated in this order.

Next, a protective film 16 composed of $SiO_2$ was formed all over the area of the substrate 11 except for a center part of the n-type electrode 18 and a center part of the pad portion P of the p-type electrode 17.

Subsequently, the substrate 11, on which the protective film 16 had been formed, was divided (chipped) to obtain the semiconductor light-emitting element 1 of Example 1, which was square having a side length of 500 μm, as shown in FIGS. 1 and 2.

Example 2

A semiconductor light-emitting element 1 of Example 2 was manufactured similar to Example 1 except that the size of the n-type electrode 18 was changed while it had the same shape as the n-type electrode 18 of Example 1. That is, a radius of an arc which forms the curved part 18b of the n-type electrode 18, which faced the pad portion P of the p-type electrode 17, was set to a value (a radius of an arc: 40 μm) which was smaller than a radius of the pad portion P. Furthermore, a side of the square, which exists as a part of the n-type electrode 18, exists in the counter side regarding the pad portion P and does not face the pad portion P of the p-type electrode 17, was reduced (length of sides: 80 μm).

Example 3

A semiconductor light-emitting element 1 of Example 3 was manufactured similar to Example 1 except that the planar form of the dielectric layer 39 formed on the area which corresponded to the form of the pad portion P was set to a circle having a diameter of 100 μm, and a radius of an arc which forms the curved part 18b of the n-type electrode 18 was set to 50 μm. Here, the form of the n-type electrode 18 had the same shape as that of Example 1.

Structural characteristics of Examples 1 to 3 are shown in Table 1.

Here, in Table 1, "curved part" means a curved part 18b which protrudes toward the side where the pad portion P exists in the planar view and was formed at a portion of the n type electrode which faced the p-type electrode 17; "radius of an arc" means radius of an arc which forms the curved part 18b. Furthermore, "D1" means distance between an outer edge of the linear portion L and an edge of the semiconductor layer 10, and "D5" means distance between the center 18a of the n-type electrode 18 and the center 10a of the semiconductor layer 10. Furthermore, "size of an area under a pad portion P" means a diameter of the dielectric layer 39 which is a circle in the planar view and overlaps with a pad portion P of the p-type electrode 17 when it is observed in the planar view. "Width of area under linear portion" means the width of the dielectric layer 39 which overlaps with the linear portion L of the P-type electrode 17 when it is observed in the planar view.

TABLE 1

| | p-type electrode | | n-type | | | Dielectric layer | | | |
|---|---|---|---|---|---|---|---|---|---|
| Examples | Diameter of a pad portion P (μm) | Width of a linear portion (μm) | electrode Radius of an curved part (μm) | D1 (μm) | D5 (μm) | Size of an area under a pad portion P (μm) | Width of area under linear portion (μm) | Length of sides of a semiconductor layer (μm) | Planar view of a semiconductor layer |
| 1 | 90 | 4 | 45 | 36 | 0 | Diameter: 90 | 14 | 500 | Square |
| 2 | 90 | 4 | 40 | 36 | 0 | Diameter: 90 | 14 | 500 | Square |
| 3 | 90 | 4 | 50 | 36 | 0 | Diameter: 100 | 14 | 500 | Square |
| 4 | 90 | 4 | 45 | 36 | −35 | Diameter: 90 | 14 | 500 | Square |
| 5 | 90 | 4 | 45 | 36 | 80 | Diameter: 90 | 14 | 500 | Square |
| 6 | 90 | 8 | 45 | 36 | 0 | Diameter: 90 | 18 | 500 | Square |
| 7 | 90 | 13 | 45 | 36 | 0 | Diameter: 90 | 23 | 500 | Square |

With respect to the semiconductor light-emitting elements of Examples 1 to 3 obtained as described above, the forward voltage (Vf) was measured through conduction by a probe with an applied current value in a range of 20 mA to 180 mA.

Furthermore, the semiconductor light-emitting elements of Examples 1 to 3 were mounted to a TO-18 can package, and the light emission output (Po) at the applied current of 20 mA to 180 mA was measured by a tester.

Figure 4A:
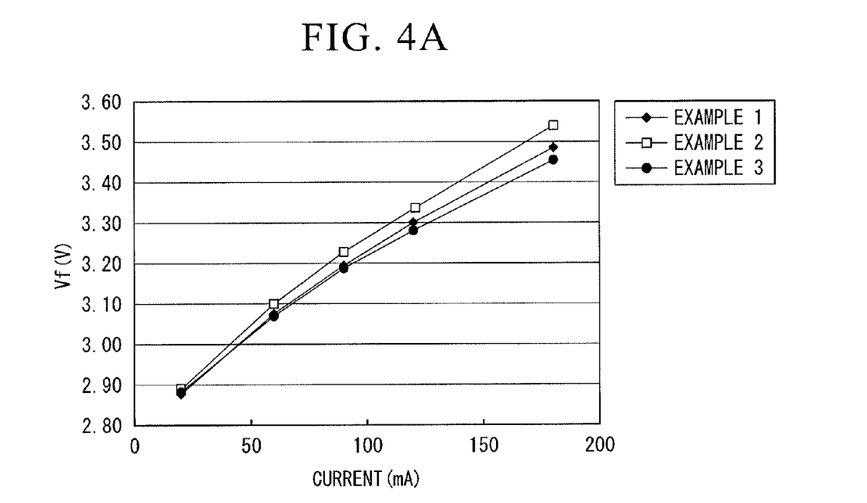
FIG. 4A is a graph which shows a relationship between a current (mA) and a forward voltage (Vf) of the semiconductor light-emitting elements of Examples 1 to 3.
Figure 4B:
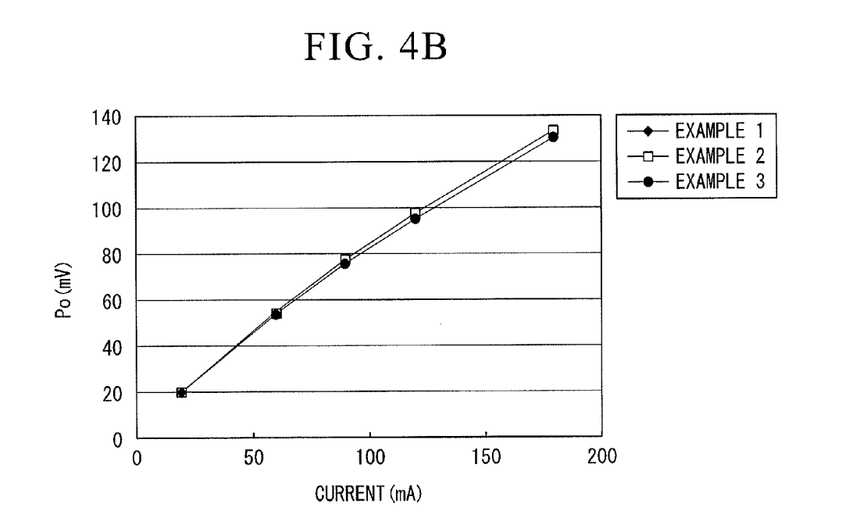
FIG. 4B is a graph which shows a relationship between a current (mA) and a light-emitting output (Po) of the semiconductor light-emitting elements of Examples 1 to 3.

The results of measurement are shown in FIG. 4.

FIG. 4A is a graph showing a relationship between a forward voltage (VF) and a current (mA) of semiconductor light-emitting elements of Examples 1 to 3, and FIG. 4B is a graph showing a relationship between a light-emitting output (Po) and a current (mA) of semiconductor light-emitting elements of Examples 1 to 3.

As shown in FIG. 4A, the larger, the radius of the curved part, the smaller the forward voltage (VF). The larger the current (mA), the larger the differences of the forward voltage (VF) according to the radius of a curved part.

Furthermore, as shown in FIG. 4B, the smaller the radius of a curved part, the lager the light-emitting output (Po).

Example 4

A semiconductor light-emitting element 1 of Example 4 was manufactured similar to Example 1 except that distance (D5) between the center 18a of the n-type electrode 18 and the center 10a of the semiconductor layer 10 was set to −35 μm (that is, the center 18a of the n-type electrode 18 was set to approach the pad portion P of the p-type electrode 17 so that the distance from the center 10a of the semiconductor layer 10 to the center 18a was decreased by 35 μm).

Example 5

A semiconductor light-emitting element 1 of Example 5 was manufactured similar to Example 1 except that distance (D5) between the center 18a of the n-type electrode 18 and the center 10a of the semiconductor layer 10 was set to +80 μm (that is, the center 18a of the n-type electrode 18 was set to be separated from the pad portion P of the p-type electrode 17 so that the distance from the center 10a of the semiconductor layer 10 to the center 18a was increased by 80 μm).

Structural characteristics of Examples 4 to 5 are shown in Table 1.

Regarding the semiconductor light-emitting elements 1 of Examples 4 and 5 obtained as described above, the forward voltage (Vf) was measured with an applied current value in a range of 20 mA to 180 mA, and the light emission output (Po) at the applied current of 20 mA to 180 mA was also measured similar to Example 1.

Figure 5A:
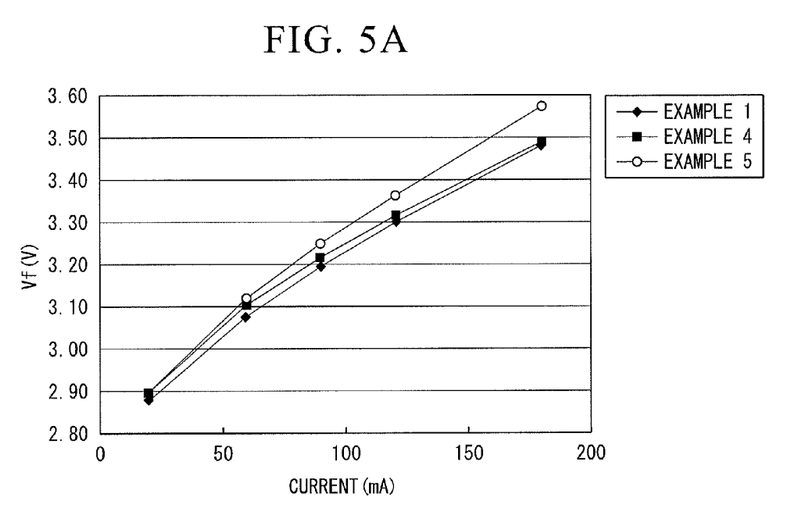
FIG. 5A is a graph which shows a relationship between a current (mA) and a forward voltage (Vf) of the semiconductor light-emitting elements of Examples 1, 4 and 5.
Figure 5B:
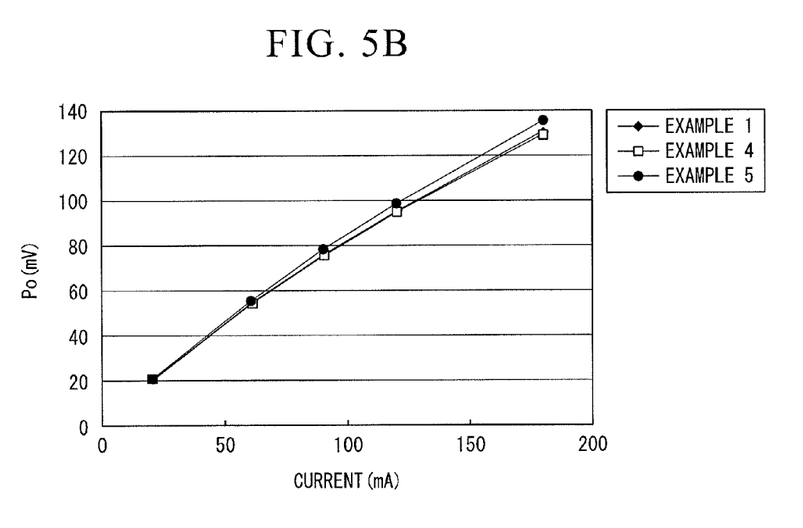
FIG. 5B is a graph which shows a relationship between a current (mA) and a light-emitting output (Po) of the semiconductor light-emitting elements of Examples 1, 4 and 5.

The results are shown in FIG. 5.

FIG. 5A is a graph showing a relationship between a forward voltage (VF) and a current (mA) of semiconductor light-emitting elements of Examples 1, 4 and 5, and FIG. 5B is a graph showing a relationship between a light-emitting output (Po) and a current (mA) of semiconductor light-emitting elements of Examples 1 to 3.

As shown in FIG. 5A, it was confirmed that the closer the distance between the n-type electrode 18 and the pad portion P of the P-type electrode 17, the smaller the forward voltage (VF) (Example 4), and that the larger the current (mA), the larger the differences of the forward voltage (VF) provided by the distance between the n-type electrode 18 and the pad portion P of the p-type electrode 17.

Furthermore, as shown in FIG. 5B, it was confirmed that the larger the distance between the n-type electrode 18 and the pad portion P of the P-type electrode 17, the larger the light-emitting output (Po) (Example 5), and that the larger the current (mA), the larger the difference of the light-emitting output (Po) provided by the distance between the n-type electrode 18 and the pad portion P of the p-type electrode 17.

Example 6

A semiconductor light-emitting element 1 of Example 6 was manufactured similar to Example 1 except that the width of the linear portion L of the P-type electrode 17 was set to 8 μm, and the width of the dielectric layer 39 which was formed in the part which overlapped with the linear portion L was set to 18 μm.

Example 7

A semiconductor light-emitting element 1 of Example 7 was manufactured similar to Example 1 except that the width of the linear portion L of the P-type electrode 17 was set to 13 μm, and the width of the dielectric layer 39 which was formed in the part which overlapped with the linear portion L was set to 23 μm.

Structural characteristics of Examples 5 and 7 are shown in Table 1.

With respect to the semiconductor light-emitting elements of Examples 6 and 7 obtained as described above, the forward voltage (Vf) was measured with an applied current value in a range of 20 mA to 180 mA, and the light emission output (Po) at the applied current of 20 mA to 180 mA was measured.

Figure 6A:
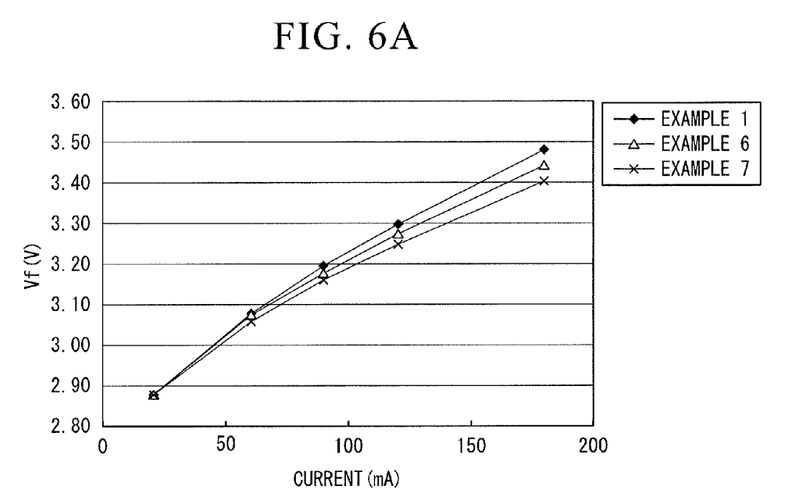
FIG. 6A is a graph which shows a relationship between a current (mA) and a forward voltage (Vf) of the semiconductor light-emitting elements of Examples 1, 6 and 7.
Figure 6B:
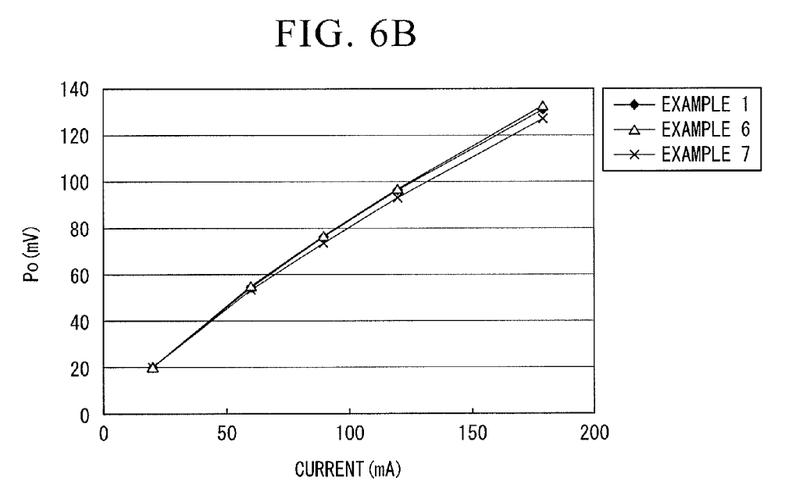
FIG. 6B is a graph which shows a relationship between a current (mA) and a light-emitting output (Po) of the semiconductor light-emitting elements of Examples 1, 6 and 7.

The results of measurement are shown in FIG. 6.

FIG. 6A is a graph showing a relationship between a forward voltage (VF) and a current (mA) of the semiconductor light-emitting elements of Examples 1, 6 and 7, and FIG. 6B is a graph showing a relationship between a light-emitting output (Po) and a current (mA) of the semiconductor light-emitting elements of Examples 1, 6 and 7.

As shown in FIG. 6A, the wider the width of the linear portion L of the P-type electrode 17, the smaller the forward voltage (VF) (Example 7), and the larger the current (mA), the larger the differences of the forward voltage (VF) according to the width of the linear portion L of the P-type electrode 17.

Furthermore, as shown in FIG. 6B, the light emission output (Po) of Example 1, wherein the width of the linear portion L of the P-type electrode 17 was 4 μm, and Example 6, wherein the width of the linear portion L of the P-type electrode 17 was 8 μm, were larger than that of Example 7 wherein the width of the linear portion L of the P-type electrode 17 was 13 μm.

Comparative Example 1

Figure 7:
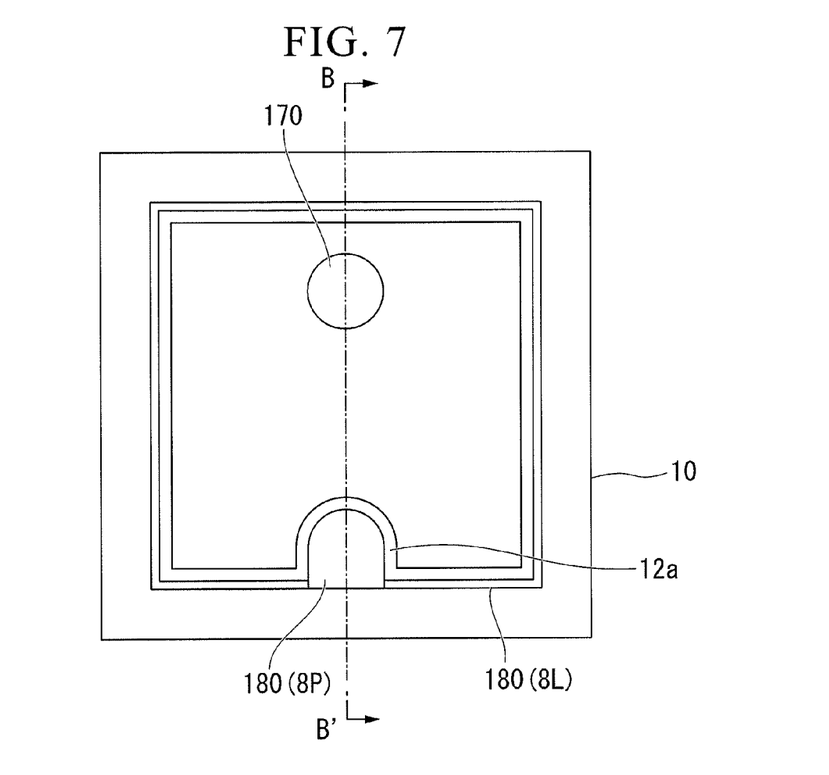
FIG. 7 shows a planar view of a comparative example of the semiconductor light-emitting element of Comparative Example 1.
Figure 8:
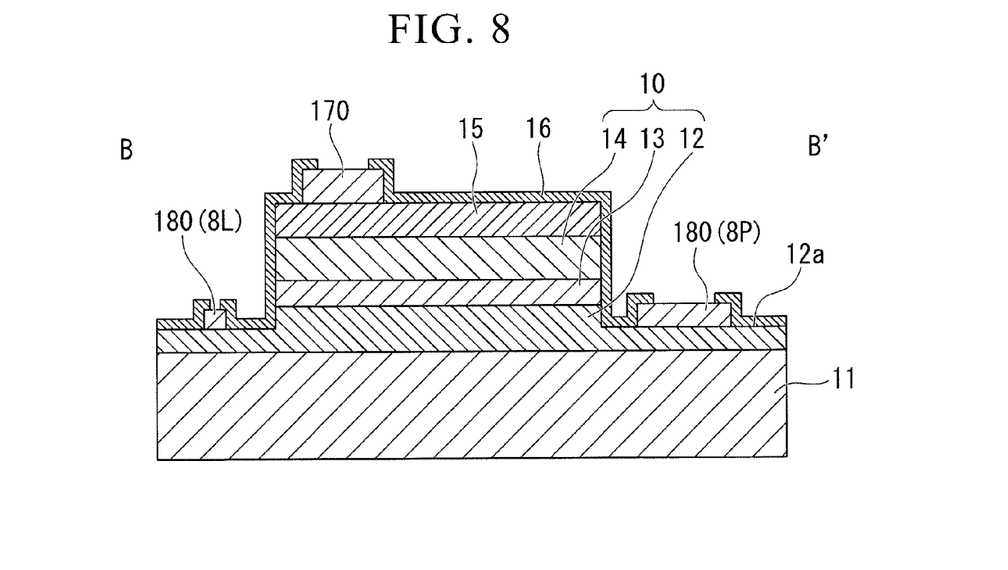
FIG. 8 shows a cross-sectional view at the line B-B' of the semiconductor light-emitting element shown in FIG. 7.

FIG. 7 shows a planar view of one example of a semiconductor light-emitting element of Comparative Example 1, and FIG. 8 shows a cross-sectional view of a cross-section at a line B-B' of the semiconductor light-emitting element shown in FIG. 7. The semiconductor light-emitting element of Comparative Example 1 which is shown in FIGS. 7 and 8 was manufactured similar to Examples 1 except that a linear portion L was not provided in the P-type electrode 17, an n-type electrode 18 was composed of a pad portion 8P and a linear portion 8L, and a dielectric layer was not provided.

In Comparative Example 1, the distance between an outer edge of the linear portion 8L of the n-type electrode 180 and an edge of the semiconductor layer 10 was set to 36 μm, and the distance between the center of the semiconductor layer and the center of the P-type electrode 170 was set to 0 μm. With respect to FIGS. 7 and 8, the same reference numerals are given to the same members as the semiconductor light-emitting element 1 shown in Example 1 and 2, and the explanation thereof will be omitted.

With respect to the semiconductor light-emitting element 1 of Comparative Example 1, the light emission output (Po) was measured at the applied current of 20 mA to 180 mA similar to Example 1.

As a result, the light emission output (Po) of Comparative Example 1 was about 10% smaller than that of Example 1.

INDUSTRIAL APPLICABILITY

A semiconductor light-emitting element wherein an output at the time of applying a high current is improved can be provided.

| Brief Description of the Reference Symbols | |
|---|---|
| 1: | Semiconductor light-emitting element |
| 5: | lamp |
| 10: | Semiconductor layer |
| 10a: | Center of the semiconductor layer |
| 11: | Substrate |
| 12: | n-type semiconductor layer |
| 12a: | Exposed surface of an n-type semiconductor layer |
| 13: | Light-emitting layer |
| 14: | p-type semiconductor layer |
| 15: | Transparent conductive film |
| 16: | Protective film |
| 17: | P-type electrode |
| 17a: | Center of a pad portion of a P-type electrode |
| 18: | N-type electrode |
| 18a: | Center of an n-type electrode |

| -continued | |
|---|---|
| Brief Description of the Reference Symbols | |
| 18b: | Curved part |
| 39: | Dielectric layer (light-reflecting layer) |
| 51, 52: | Frame |
| 53, 54: | Wire |
| 55: | Mold |
| 170: | P-type electrode |
| 180: | N-type electrode |
| D1: | Distance between an outer edge of a linear portion of a p-type electrode and an edge of a semiconductor layer |
| D2: | Diameter of a pad portion of a p-type electrode |
| D3: | Distance between an n-type electrode and a pad portion |
| D4: | Distance between the center of a pad portion and the center of a semiconductor layer |
| D5: | Distance between the center of an n-type electrode and the center of a semiconductor layer |
| P, 8P: | Pad portion of a p-type electrode |
| L, 8L: | Linear portion of a P-type electrode |
| L1: | Straight line |
| Po: | Light-emitting output |
| Vf: | Forward voltage |

The invention claimed is:

1. A semiconductor light-emitting element which comprises:
a substrate,
a semiconductor layer formed on the substrate, wherein the semiconductor layer includes an n-type semiconductor layer, a light-emitting layer and a p-type semiconductor layer;
an n-type electrode which is provided on an exposed surface of the n-type semiconductor layer, wherein the exposed surface is exposed by removing a part of the semiconductor layer,
a transparent conductive film which is provided on the semiconductor layer,
a p-type electrode which is provided on the transparent conductive film, and
a light-reflecting layer which is provided between the semiconductor layer and the transparent conductive film, wherein at least a part of the light-reflecting layer overlaps with the p-type electrode when the light-reflecting layer is observed in planar view, wherein
the p-type electrode comprises a pad portion and a linear portion which linearly extends from the pad portion and has an annular structure when the linear portion is observed in planar view,
the n-type electrode exists in an inner area, which is surrounded by the linear portion, and exists on a straight line which goes through a center of the pad portion and a center of the semiconductor layer when the electrode is observed in planar view,
a distance between the center of the n-type electrode and the center of the pad portion is greater than or equal to a distance between the center of the pad portion and the center of the semiconductor layer,
the area of the light-reflecting layer is in a range of 30% to 200% based on the area of the p-type electrode, and
a distance between an outer edge of the linear portion of the p-type electrode and an edge of the semiconductor layer is in a range of 30 to 120 μm.

2. The semiconductor light-emitting element according to claim 1, wherein the linear portion is divided at a part thereof.

3. The semiconductor light-emitting element according to claim 1, wherein a form of a part of the n-type electrode, which faces the pad portion, is a curved part which protrudes to the pad portion side when the part is observed in the planar view.

4. The semiconductor light-emitting element according to claim 1, wherein the light-reflecting layer is composed of an insulating material.

5. The semiconductor light-emitting element according to claim 1, wherein
the refractive index of the semiconductor layer is in a range of 1.9 to 2.6, and
the refractive index of the transparent conductive film is in a range of 1.9 to 2.2, and
the light-reflecting layer is composed of $SiO_2$.

6. The semiconductor light-emitting element according to claim 1, wherein the semiconductor layer has a form of a rectangle, wherein the side length of the rectangle is in a range of 450 μm to 1.5 mm, when it is observed in planar view and the width of the linear portion is in a range of 0.1 μm to 20 μm.

7. A lamp which is equipped with the semiconductor light-emitting element according to claim 1.

8. An electronic device which is equipped with the lamp according to claim 7.

9. A machine which is equipped with the electronic device according to claim 8.

10. The semiconductor light-emitting element according to claim 1, wherein the area of the light-reflecting layer is in a range of 70% to 150% based on the area of the p-type electrode.

11. The semiconductor light-emitting element according to claim 1, wherein the area of the light-reflecting layer is in a range of 80% to 130% based on the area of the p-type electrode.

12. The semiconductor light-emitting element according to claim 1, wherein a resistivity of the transparent conductive film is in a range of $10^{-5}$ to $10^{-1}$ Ω·cm.

13. The semiconductor light-emitting element according to claim 1, wherein a side length of the semiconductor layer is in a range of 450 μm to 600 μm.

14. The semiconductor light-emitting element according to claim 1, wherein a width of the linear portion of the p-type electrode is in a range of 0.1 μm to 20 μm.

15. The semiconductor light-emitting element according to claim 1, wherein a width of the linear portion L of the p-type electrode is in a range of 0.1 μm to 15 μm.

16. The semiconductor light-emitting element according to claim 1, wherein a thickness of the p-type electrode is within a range of 100 nm to 40 μm.

17. The semiconductor light-emitting element according to claim 1, wherein a thickness of the p-type electrode is within a range of 300 nm to 10 μm.

18. The semiconductor light-emitting element according to claim 1, wherein the p-type electrode consists of the pad portion and the linear portion which connects with and linearly extends from the pad portion and has an annular structure, when the linear portion is observed in planar view.

* * * * *